(12) United States Patent
Chen et al.

(10) Patent No.: US 11,989,498 B2
(45) Date of Patent: *May 21, 2024

(54) FINFET SEMICONDUCTOR DEVICE GROUPING

(71) Applicant: Taiwan Semiconductor Manufacturing Company, Ltd., Hsinchu (TW)

(72) Inventors: Yi-Tzu Chen, Hsinchu (TW); Hau-Tai Shieh, Hsinchu (TW); Che-Ju Yeh, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/161,627

(22) Filed: Jan. 30, 2023

(65) Prior Publication Data

US 2023/0245677 A1 Aug. 3, 2023

Related U.S. Application Data

(63) Continuation of application No. 17/226,428, filed on Apr. 9, 2021, now Pat. No. 11,568,121.

(Continued)

(51) Int. Cl.
*G06F 30/392* (2020.01)
*G06F 17/16* (2006.01)
(Continued)

(52) U.S. Cl.
CPC ............ *G06F 30/392* (2020.01); *G06F 17/16* (2013.01); *G06N 3/063* (2013.01); *G11B 5/09* (2013.01);

(Continued)

(58) Field of Classification Search
CPC ......... G11B 5/09; G11B 5/3146; G06F 17/16; G06F 30/392; G06F 30/398; G06N 3/063;
(Continued)

(56) References Cited

U.S. PATENT DOCUMENTS 7,586,780 B2 9/2009 Suzuki
10,483,830 B2 11/2019 Guo et al.
(Continued)

FOREIGN PATENT DOCUMENTS

CN 107667430 A 2/2018
CN 105304123 B * 6/2018 ........... G11C 11/412
(Continued)

OTHER PUBLICATIONS

Jo et al., "Design Rule Evaluation Framework Using Automatic Cell Layout Generator for Design Technology Co-Optimization," IEEE Transactions on Very Large Scale Integration (VLSI) Systems, vol. 27, No. 8, pp. 1933-1946 (Aug. 2019).

(Continued)

*Primary Examiner* — Fernando Hidalgo
(74) *Attorney, Agent, or Firm* — MERCHANT & GOULD P.C.

(57) ABSTRACT

A method of designing a circuit is provided. The method includes: providing a circuit; selecting a first NMOS fin field-effect transistor (FinFET) in the circuit; and replacing the first NMOS FinFET having a first fin number with a second NMOS FinFET having a second fin number and a third NMOS FinFET having a third fin number, wherein the sum of the second fin number and the third fin number is equal to the first fin number.

20 Claims, 12 Drawing Sheets

Related U.S. Application Data

(60) Provisional application No. 63/041,456, filed on Jun. 19, 2020.

(51) Int. Cl.
   *G06N 3/063* (2023.01)
   *G11B 5/09* (2006.01)
   *G11B 5/31* (2006.01)
   *G11C 11/418* (2006.01)
   *G11C 11/54* (2006.01)
   *H01L 27/092* (2006.01)
   *H10B 10/00* (2023.01)

(52) U.S. Cl.
   CPC .......... *G11B 5/3146* (2013.01); *G11C 11/418* (2013.01); *G11C 11/54* (2013.01); *H01L 27/0924* (2013.01); *H10B 10/12* (2023.02); *H10B 10/18* (2023.02)

(58) Field of Classification Search
   CPC ..... G11C 11/418; G11C 11/54; G11C 11/419; G11C 16/0483; G11C 7/18; G11C 8/08; G11C 11/412; G11C 7/1096; G11C 8/10; G11C 11/417; H01L 27/0924; H01L 27/0207; H10B 10/12; H10B 10/18
   USPC ......................................................... 365/154
   See application file for complete search history.

(56) References Cited

U.S. PATENT DOCUMENTS

| | | | | |
|---|---|---|---|---|
| 10,535,774 | B1* | 1/2020 | Wang | H01L 21/823431 |
| 11,080,453 | B2 | 8/2021 | Huang et al. | |
| 11,568,121 | B2* | 1/2023 | Chen | H10B 10/18 |
| 2002/0056679 | A1 | 5/2002 | Sato | |
| 2005/0224890 | A1 | 10/2005 | Bernstein et al. | |
| 2009/0014798 | A1 | 1/2009 | Zhu et al. | |
| 2009/0085121 | A1 | 4/2009 | Park et al. | |
| 2012/0236675 | A1 | 9/2012 | Chan et al. | |
| 2013/0330916 | A1 | 12/2013 | Pham et al. | |
| 2014/0061801 | A1 | 3/2014 | Doornbos et al. | |
| 2015/0076609 | A1 | 3/2015 | Xie et al. | |
| 2015/0348598 | A1 | 12/2015 | Wang et al. | |
| 2017/0110164 | A1 | 4/2017 | Cheng et al. | |
| 2017/0236823 | A1 | 8/2017 | Lee et al. | |
| 2017/0351802 | A1 | 12/2017 | Chang et al. | |
| 2018/0198232 | A1 | 7/2018 | Troufflard et al. | |
| 2018/0204775 | A1 | 7/2018 | Cheng et al. | |
| 2018/0336944 | A1 | 11/2018 | Chen et al. | |
| 2019/0229183 | A1 | 7/2019 | Wang et al. | |
| 2020/0144267 | A1 | 5/2020 | Lee et al. | |
| 2021/0310880 | A1* | 10/2021 | Gu | G01K 7/425 |
| 2021/0344336 | A1* | 11/2021 | Salcedo | H01L 27/0262 |

FOREIGN PATENT DOCUMENTS

| | | | |
|---|---|---|---|
| CN | 105304123 B | 6/2018 | |
| CN | 109860291 A | 6/2019 | |
| CN | 111243502 A | 6/2020 | |
| DE | 10 2016 117 328 A1 | 4/2017 | |
| DE | 10 2019 128 996 A1 | 4/2020 | |
| TW | 201535718 A | 9/2015 | |
| WO | 2018/184771 A1 | 10/2018 | |
| WO | WO-2018184771 A1 * | 10/2018 | ............. G01C 19/10 |

OTHER PUBLICATIONS

Korean Office Action for Application No. 10-2021-0074267 dated Oct. 27, 2022, 5 pages.

Allen et al., "5.4 Current Mirrors and Current Amplifiers," CMOS Analog Circuit Design, Holt, Rinehart and Winston, Inc., pp. 231-233 (1987).

* cited by examiner

FINFET SEMICONDUCTOR DEVICE GROUPING

PRIORITY CLAIM AND CROSS-REFERENCE

This application is a Continuation of U.S. application Ser. No. 17/226,428, filed Apr. 9, 2021, now U.S. Pat. No. 11,568,121, which claims priority to U.S. Provisional Application No. 63/041,456, filed Jun. 19, 2020, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the mainstream course of IC evolution, functional density (i.e., the number of interconnected devices per chip area) has generally increased while geometry size (i.e., the smallest component that can be created using a fabrication process) has decreased. However, this mainstream evolution needs to follow the Moore's rule by a huge investment in facility establishment. Therefore, it has been a constant need to develop ICs with smaller chip areas, lower costs, and lower leakage currents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
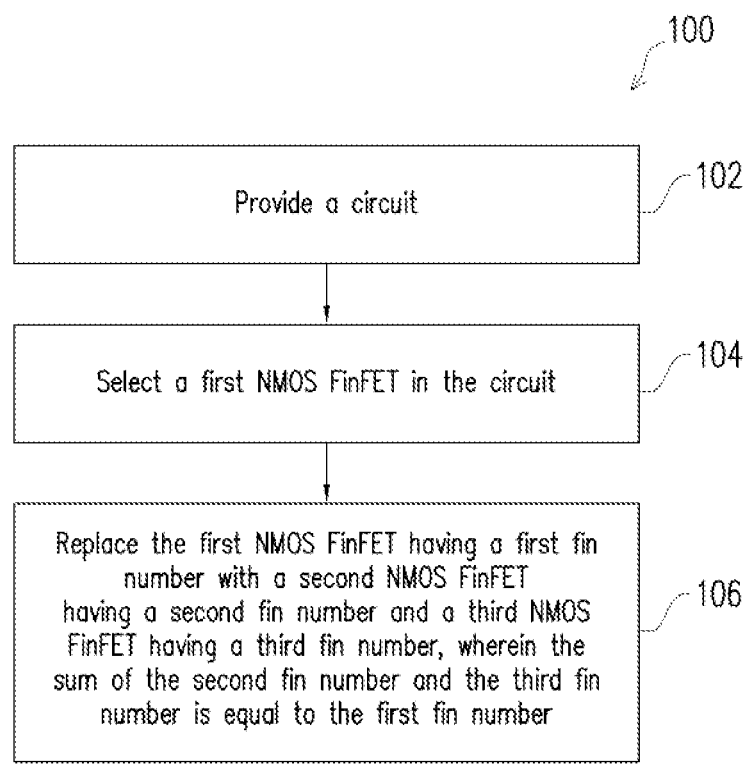
FIG. 1 is a flow chart illustrating an example method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the integrated circuit (IC) size is reduced, there were efforts to overcome problems faced with such size reduction. For example, the performance of a fin field-effect transistor (FinFET) is degraded from reduced channel length, including leakage current. Vertical semiconductor devices, such as FinFET, are three-dimensional structures on the surface of a semiconductor substrate. Fins extend upwards from the body of the substrate, and may be formed by depositing fin material on the substrate, etching non-fin areas of the substrate, or a combination thereof. The channel of the FinFET is formed in this vertical fin, and a gate is provided over (e.g., wrapping) the fin. Wrapping the gate around the fin increases the contact area between the channel region and the gate and allows the gate to control the channel from both sides. As integrated circuit devices get smaller, spacing or "pitch" between devices may result in electromagnetic interference among adjacent devices. Therefore, new methods and structures to improve the FinFET performance are desired. Specifically, circuit designers may implement circuit designs on advanced FinFET technology nodes (e.g., N10, N7, N5, etc.) based on minimum device finger and total fin number considerations. For low power applications, if wrong PMOS or NMOS fin sizes are used in circuit designs, circuit leakage currents will be higher.

In accordance with some embodiments, methods for FinFET semiconductor device grouping are provided. In general, optimal fin grouping design is applied to some devices to achieve lower leakage current (Ioff) at the same saturation current (Idsat) speed operation. A PMOS FinFET with a larger fin size has a higher saturation-to-leakage ratio due to a higher hole mobility, while an NMOS FinFET with a smaller fin size has a higher saturation-to-leakage ratio due to a higher electron mobility. By swapping fin size selection based on PMOS and NMOS attributes, the circuit leakage currents will be reduced. In some embodiments discussed below, leakage current can be reduced by more than 5%-10% at the same saturation current speed operation by swapping fin size selection without any additional circuitry change.

Specifically, a FinFET has a saturation current (Idsat) which is associated with the turning-speed of the FinFET and a leakage current (Ioff) at the off state of the FinFET. Different fin sizes of the FinFET may cause different saturation-to-leakage ratio (Idsat/Ioff) characteristics, because different fin sizes have different isolation stress including compressive stress and tensile stress, which will be described in detail below.

For an n-type FinFET (also known as "NMOS FinFET," used interchangeably herein), the source/drain of the NMOS FinFET may include a tensile stress material. Tensile stress is the stress state caused by an applied load tends to elongate the material along the axis of the applied load, in other words, the stress caused by pulling the material. The strength of structures of equal cross-sectional area loaded in tension is independent of shape of the cross-section. In some embodiments, the tensile stress material may be a material (e.g., boron) having a smaller lattice constant in comparison to silicon. The tensile stress material may improve mobility of carriers (i.e., electron mobility for NMOS FinFET) in a channel region by applying tensile stress to the fin structure of the NMOS FinFET. As a result, an NMOS FinFET with a smaller fin size has a higher saturation-to-leakage ratio due to a higher electron mobility, therefore having a lower leakage current under the same saturation current condition.

On the other hand, for a p-type FinFET (also known as "PMOS FinFET," used interchangeably herein), the source/drain of the PMOS FinFET may include a compressive stress material. Compressive stress (or compression) is the stress state caused by an applied load that acts to reduce the length of the length of the material (compression member) along the axis of the applied load, it is, in other words, a stress state that causes a squeezing of the material. In some embodiments, the compressive stress material may be a material (e.g., silicon-germanium) having a large lattice constant in comparison to silicon. The compressive stress material may improve mobility of carriers (i.e., hole mobility for PMOS FinFET) in a channel region by applying compressive stress to the fin structure of the PMOS FinFET. As a result, a PMOS FinFET with a larger fin size has a higher saturation-to-leakage ratio due to a higher hole mobility, therefore having a lower leakage current under the same saturation current condition.

As such, it is desirable to have a smaller fin size for an NMOS FinFET while have a larger fin size for a PMOS FinFET, in order to have a lower leakage current under the same saturation current condition. Thus, by breaking down one NMOS FinFET with a large fin size (e.g., 3 fins) into multiple NMOS FinFETs with smaller fin sizes (e.g., one with 2 fins and another with 1 fin), the leakage current will be reduced. This method can be applied to any NMOS FinFET in a circuit during a circuit design, and details will be described below with reference to FIG. 1. On the other hand, by grouping multiple PMOS FinFETs with small fin sizes (e.g., one with 2 fins and another with 1 fin) into one PMOS FinFET with larger fin sizes (e.g., 3 fins), the leakage current will be reduced. This method can be applied to any NMOS FinFET in a circuit during a circuit design, and details will be described below with reference to FIG. 3.

FIG. 1 is a flow chart illustrating an example method 100 in accordance with some embodiments. In the example shown in FIG. 1, the method 100 starts at step 102 where a circuit is provided. The circuit can be any circuit that includes NMOS FinFETs. In some non-limiting examples, the circuit is an analog circuit that deals with continuous analog signals. For example, the analog circuit may include at least one of: a differential amplifier, an operational amplifier (Op Amp), a radio frequency (RF) amplifier, a comparator, a current mirror, an analog multiplier, an analog divider, an analog-to-digital converter (ADC), a digital-to-analog converter (DAC), a voltage controlled oscillators (VCO), an I/Q modulator, and an analog switch multiplexer or the like. On the other hand in some non-limiting examples, the circuit is a digital circuit that deals with discrete digital signals. For example, the digital circuit may include at least one of: a logic AND gate, a logic OR gate, an inverter, a logic NAND gate, a logic NOR gate, a flip flop, a multiplexer (i.e., a data selector), a synchronous sequential logic circuit, an asynchronous sequential logic circuit or the like.

The method 100 then proceeds to step 104 where a first NMOS FinFET in the circuit is selected. The first NMOS FinFET is often selected based on considerations associated with the saturation current (Idsat) and the leakage current (Ioff) of the first NMOS FinFET, though theoretically any NMOS FinFET in the circuit may be selected. For instance, the first NMOS FinFET may be a NMOS FinFET in a write driver of a static random-access-memory (SRAM) device (details of which will be described below with reference to FIG. 7A), as the leakage current of that NMOS FinFET in the write driver contributes significantly to the overall leakage of the SRAM device. It should be noted that NMOS FinFETs in the circuit other than the first NMOS FinFET may also be selected. In other words, multiple NMOS FinFETs in the circuit may be selected at step 104.

The method 100 then proceeds to step 106 where the first NMOS FinFET is replaced with a second NMOS FinFET and a third NMOS FinFET. Specifically, the first NMOS FinFET has a first fin number, the second NMOS FinFET has a second fin number, and the third NMOS FinFET has a third fin number. The larger the fin number is, the wider the overall fin structure is. The first fin number is equal to the sum of the second fin number and the third fin number. As such, the width of the overall fin structure is unchanged after the replacement. However, the overall leakage current of the second NMOS FinFET and the third NMOS FinFET is smaller than that of the first NMOS FinFET, because an NMOS FinFET with a smaller fin size has a higher saturation-to-leakage ratio due to a higher electron mobility.

Figure 2A:
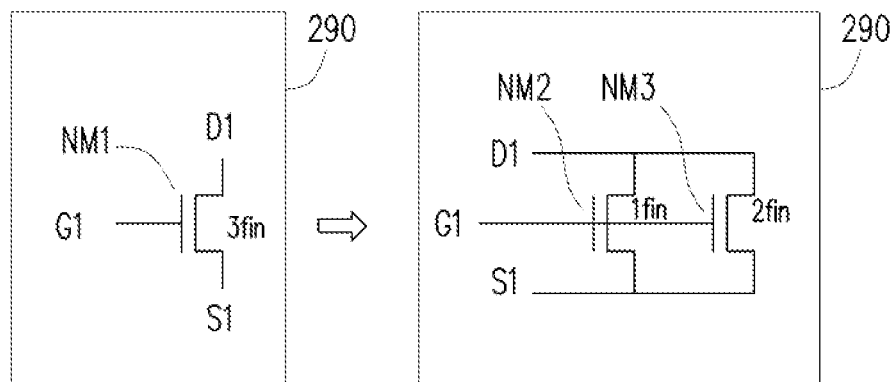
FIG. 2A is a diagram illustrating a replacement of a NMOS FinFET using the method of FIG. 1 in accordance with some embodiments.
Figure 2B:
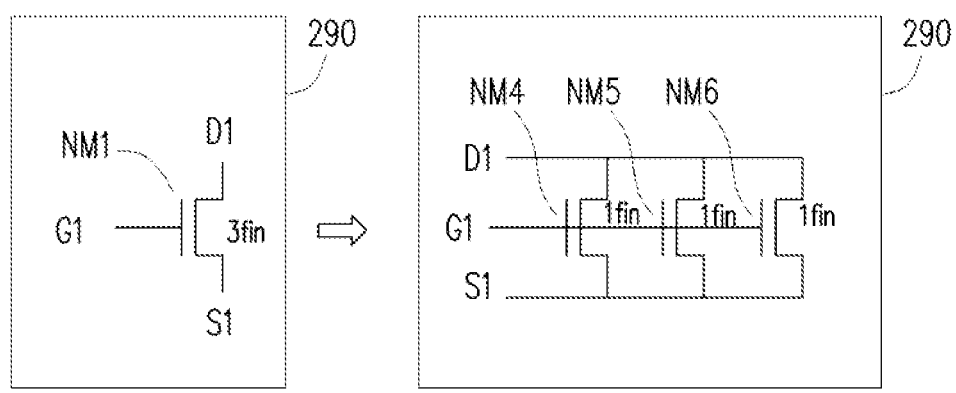
FIG. 2B is a diagram illustrating another replacement of a NMOS FinFET using the method of FIG. 1 in accordance with some embodiments.

FIG. 2A is a diagram illustrating a replacement of a NMOS FinFET using the method 100 of FIG. 1 in accordance with some embodiments. FIG. 2B is a diagram illustrating another replacement of a NMOS FinFET using the method 100 of FIG. 1 in accordance with some embodiments. As shown in FIG. 2A, a NMOS FinFET NM1, which is in a circuit 290, is selected at step 104 shown in FIG. 1. The NMOS FinFET NM1 has a gate G1, a source S1, and a drain D1. Specifically, the NMOS FinFET NM1 has three fins (i.e., a gate structure is over three parallel fin structures and controls those three fin structures). At step 106 shown in FIG. 1, the NMOS FinFET NM1 is replaced with a NMOS FinFET NM2 and a NMOS FinFET NM3. Specifically, the NMOS FinFET NM2 has one fin, while the NMOS FinFET NM3 has two fins. The NMOS FinFET NM2 has the gate G1, the source S1, and the drain D1; the NMOS FinFET NM3 has the gate G1, the source S1, and the drain D1 as well. In other words, the gates, the sources, and the drains of the NMOS FinFETs NM2 and NM3 are connected, respectively. As such, the overall fin number, which corresponds to the overall fin size, is unchanged (i.e., both are three) after the replacement at step 106 shown in FIG. 1. However, the overall leakage current of the NMOS FinFETs NM2 and NM3 is smaller than that of the NMOS FinFET NM1, because an NMOS FinFET with a smaller fin size has a higher saturation-to-leakage ratio due to a higher electron mobility. As such, the overall leakage current is reduced after the replacement at step 106 shown in FIG. 1.

Alternatively as shown in FIG. 2B, the NMOS FinFET NM1 is replaced with a NMOS FinFET NM4, a NMOS FinFET NM5, and a NMOS FinFET NM6. Specifically, the NMOS FinFET NM4 has one fin, the NMOS FinFET NM5 has one fin, and the NMOS FinFET NM6 has one fin. The NMOS FinFET NM4 has the gate G1, the source S1, and the drain D1; the NMOS FinFET NM5 has the gate G1, the source S1, and the drain D1 as well; the NMOS FinFET NM6 has the gate G1, the source S1, and the drain D1 as well. In other words, the gates, the sources, and the drains of the NMOS FinFETs NM4, NM5, and NM6 are connected, respectively. As such, the overall fin number, which corresponds to the overall fin size, is unchanged (i.e., both are three) after the replacement at step 106 shown in FIG. 1. However, the overall leakage current of the NMOS FinFETs NM4, NM5, and NM6 is smaller than that of the NMOS FinFET NM1, because an NMOS FinFET with a smaller fin size has a higher saturation-to-leakage ratio due to a higher electron mobility. As such, the overall leakage current is reduced after the replacement at step 106 shown in FIG. 1.

It should be noted that the method 100 may be applied to any NMOS FinFET in a circuit and FIG. 2A and FIG. 2B are simply examples. In one example, a NMOS FinFET having two fins may be replaced with two NMOS FinFETs, where each of them has one fin. In one example, a NMOS FinFET having four fins may be replaced with: (1) four NMOS FinFETs, each of them having one fin; (2) a NMOS FinFET having two fins and two NMOS FinFETs, each of which having one fin; (3) a NMOS FinFET having three fins and a NMOS FinFET having one fin; and (4) two NMOS FinFETs, each of which having two fins. In one example, a NMOS FinFET having five fins may be replaced with: (1) five NMOS FinFETs, each of them having one fin; (2) a NMOS FinFET having two fins and three NMOS FinFETs, each of which having one fin; (3) a NMOS FinFET having three fins and two NMOS FinFETs, each of which having one fin; (4) a NMOS FinFET having four fins and a NMOS FinFET having one fin; (5) a NMOS FinFET having one fin and two NMOS FinFETs, each of which having two fins; and (6) a NMOS FinFET having two fins and a NMOS FinFET having three fins. Again, this method 100 shown in FIG. 1 may be applied to a NMOS FinFET with N fins, where N is an integer greater than one. As shown by simulation results, by implementing the method 100 as shown in FIG. 1, leakage currents may be reduced by 7-20% for standard voltage (e.g., 200 mV), by 10-25% for low voltage (e.g., 150 mV), and by 10-25% for ultra-low voltage (e.g., 100 mV), respectively, under the following conditions: using a typical process; operating at 0.75V; and at a temperature of 85° C.

Figure 3:
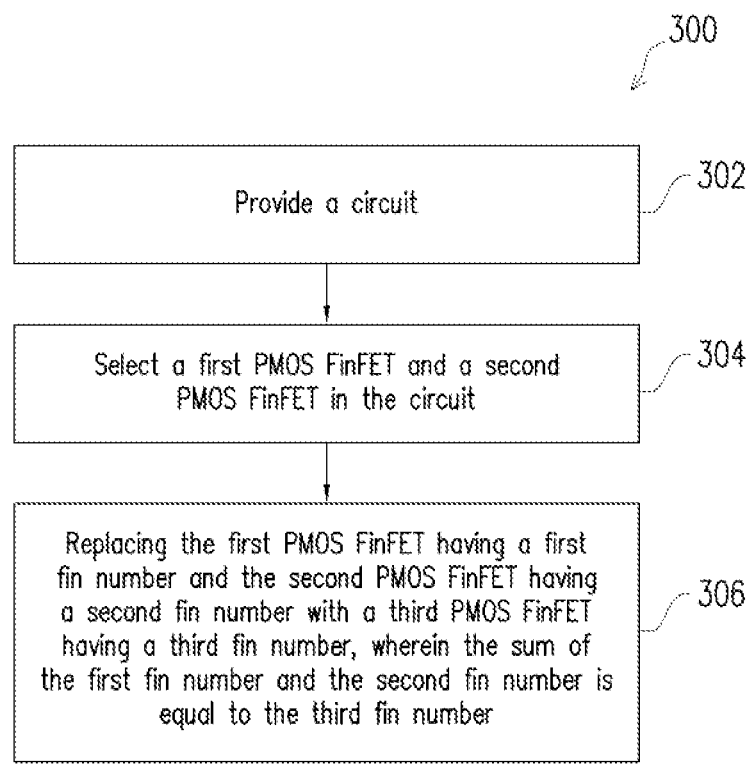
FIG. 3 is a flow chart illustrating an example method in accordance with some embodiments.

FIG. 3 is a flow chart illustrating an example method 300 in accordance with some embodiments. In the example shown in FIG. 3, the method 300 starts at step 302 where a circuit is provided. The circuit can be any circuit that includes PMOS FinFETs. In some non-limiting examples, the circuit is an analog circuit that deals with continuous analog signals. For example, the analog circuit may include at least one of: a differential amplifier, an operational amplifier (Op Amp), a radio frequency (RF) amplifier, a comparator, a current mirror, an analog multiplier, an analog divider, an analog-to-digital converter (ADC), a digital-to-analog converter (DAC), a voltage controlled oscillators (VCO), an I/Q modulator, and an analog switch multiplexer or the like. On the other hand in some non-limiting examples, the circuit is a digital circuit that deals with discrete digital signals. For example, the digital circuit may include at least one of: a logic AND gate, a logic OR gate, an inverter, a logic NAND gate, a logic NOR gate, a flip flop, a multiplexer (i.e., a data selector), a synchronous sequential logic circuit, an asynchronous sequential logic circuit or the like.

The method 300 then proceeds to step 304 where a first PMOS FinFET and a second PMOS FinFET in the circuit are selected. The first PMOS FinFET and the second PMOS FinFET are often selected based on considerations associated with the saturation current (Idsat) and the leakage current (Ioff) of the first PMOS FinFET and the second PMOS FinFET, though theoretically any two of PMOS FinFETs in the circuit may be selected. For instance, the first PMOS FinFET and the second PMOS FinFET may be PMOS FinFETs in header cells of a SRAM device (details of which will be described below with reference to FIG. 7A), as the leakage currents of that PMOS FinFETs in the header cells contribute significantly to the overall leakage of the SRAM device. It should be noted that PMOS FinFETs in the circuit other than the first PMOS FinFET and the second PMOS FinFET may also be selected in addition to the first PMOS FinFET and second PMOS FinFET. In other words, more than two (e.g., four) PMOS FinFETs in the circuit may be selected at step 304.

The method 300 then proceeds to step 306 where the first PMOS FinFET and the second PMOS FinFET are replaced with a third PMOS FinFET. Specifically, the first PMOS FinFET has a first fin number, the second PMOS FinFET has a second fin number, and the third PMOS FinFET has a third fin number. The larger the fin number is, the wider the overall fin structure is. The third fin number is equal to the sum of the first fin number and the second fin number. As such, the width of the overall fin structure is unchanged after the replacement. However, the leakage current of the third PMOS FinFET is smaller than the overall leakage current of the first PMOS FinFET and the second PMOS FinFET, because a PMOS FinFET with a larger fin size has a higher saturation-to-leakage ratio due to a higher hole mobility.

Figure 4A:
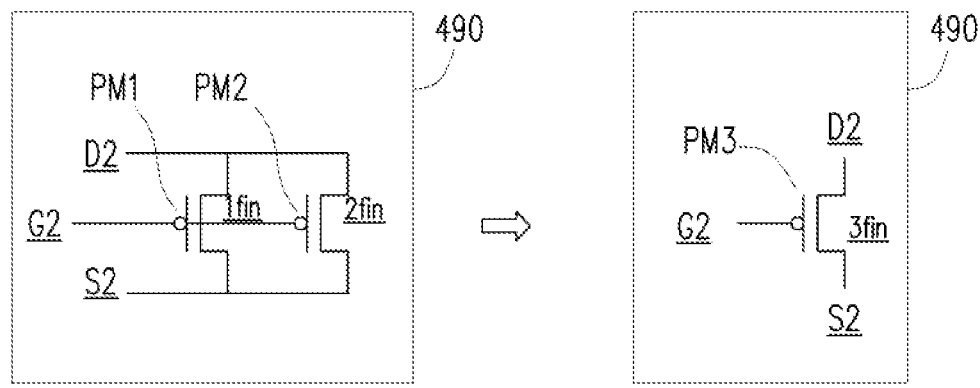
FIG. 4A is a diagram illustrating a replacement of PMOS FinFETs using the method of FIG. 3 in accordance with some embodiments.
Figure 4B:
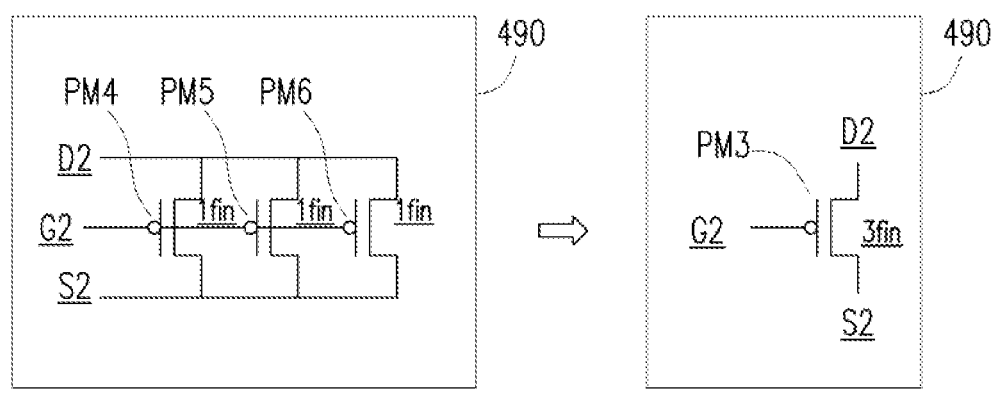
FIG. 4B is a diagram illustrating another replacement of PMOS FinFETs using the method of FIG. 3 in accordance with some embodiments.

FIG. 4A is a diagram illustrating a replacement of PMOS FinFETs using the method 300 of FIG. 3 in accordance with some embodiments. FIG. 4B is a diagram illustrating another replacement of PMOS FinFETs using the method 300 of FIG. 3 in accordance with some embodiments. As shown in FIG. 4A, two PMOS FinFETs PM1 and PM2, which are in a circuit 490, are selected at step 304 shown in FIG. 3. Specifically, the PMOS FinFET PM1 has one fin (i.e., a gate structure is over one fin structure and controls this fin structure), while the PMOS FinFET PM2 has two fins (i.e., a gate structure is over two fin structures and controls those two fin structures). The PMOS FinFET PM1 has a gate G2, a source S2, and a drain D2; the PMOS FinFET PM2 has the gate G2, the source S2, and the drain D2. In other words, the gates, the sources, and the drains of the PMOS FinFETs PM1 and PM2 are connected, respectively. At step 306 shown in FIG. 3, the PMOS FinFETs PM1 and PM2 are replaced with a PMOS FinFET PM3. Specifically, the PMOS FinFET PM3 has three fins. The PMOS FinFET PM3 has the gate G2, the source S2, and the drain D2. As such, the overall fin number, which corresponds to the overall fin size, is unchanged (i.e., both are three) after the replacement at step 306 shown in FIG. 3. However, the leakage current of the PMOS FinFET PM3 is smaller than the overall leakage current of the PMOS FinFET PM1 and the PMOS FinFET PM2, because a PMOS FinFET with a larger fin size has a higher saturation-to-leakage ratio due to a higher hole mobility. As such, the overall leakage current is reduced after the replacement at step 306 shown in FIG. 3.

Alternatively as shown in FIG. 4B, three PMOS FinFETs PM4, PM5, and PM6, which are in the circuit 490, are selected at step 304 shown in FIG. 3. Specifically, the PMOS FinFET PM4 has one fin, the PMOS FinFET PM5 has one fin, while the PMOS FinFET PM6 has one fin. The PMOS FinFET PM4 has a gate G2, a source S2, and a drain D2; the PMOS FinFET PM5 has the gate G2, the source S2, and the drain D2 as well; the PMOS FinFET PM6 has the gate G2, the source S2, and the drain D2 as well. In other words, the gates, the sources, and the drains of the PMOS FinFETs PM4, PM5, and PM6 are connected, respectively. At step 306 shown in FIG. 3, the PMOS FinFETs PM4, PM5, and PM6 are replaced with a PMOS FinFET PM3. Specifically, the PMOS FinFET PM3 has three fins. The PMOS FinFET PM3 has the gate G2, the source S2, and the drain D2. As such, the overall fin number, which corresponds to the overall fin size, is unchanged (i.e., both are three) after the replacement at step 306 shown in FIG. 3. However, the leakage current of the PMOS FinFET PM3 is smaller than the overall leakage current of the PMOS FinFET PM4, the PMOS FinFET PM5, and the PMOS FinFET PM6, because a PMOS FinFET with a larger fin size has a higher saturation-to-leakage ratio due to a higher hole mobility. As such, the overall leakage current is reduced after the replacement at step 306 shown in FIG. 3.

It should be noted that the method 300 may be applied to any PMOS FinFETs in a circuit and FIG. 4A and FIG. 4B are simply examples. In one example, a PMOS FinFET having two fins may be used to replace two PMOS FinFETs, and each of them has one fin. In one example, a PMOS FinFET having four fins may be used to replace: (1) four PMOS FinFETs, each of them having one fin; (2) a PMOS FinFET having two fins and two PMOS FinFETs, each of which having one fin; (3) a PMOS FinFET having three fins and a PMOS FinFET having one fin; and (4) two PMOS FinFETs, each of which having two fins. In one example, a PMOS FinFET having five fins may be used to replace: (1) five PMOS FinFETs, each of them having one fin; (2) a PMOS FinFET having two fins and three PMOS FinFETs, each of which having one fin; (3) a PMOS FinFET having three fins and two PMOS FinFETs, each of which having one fin; (4) a PMOS FinFET having four fins and a PMOS FinFET having one fin; (5) a PMOS FinFET having one fin and two PMOS FinFETs, each of which having two fins; and (6) a PMOS FinFET having two fins and a PMOS FinFET having three fins. Again, this method 300 shown in FIG. 3 may be applied to multiple PMOS FinFETs with a total fin number of N, where N is an integer greater than one. As shown by simulation results, by implementing the method 100 as shown in FIG. 1, leakage currents may be reduced by 7-20% for standard voltage (e.g., 200 mV), by 10-25% for low voltage (e.g., 150 mV), and by 10-25% for ultra-low voltage (e.g., 100 mV), respectively, under the following conditions: using a typical process; operating at 0.75V; and at a temperature of 85° C.

Figure 5:
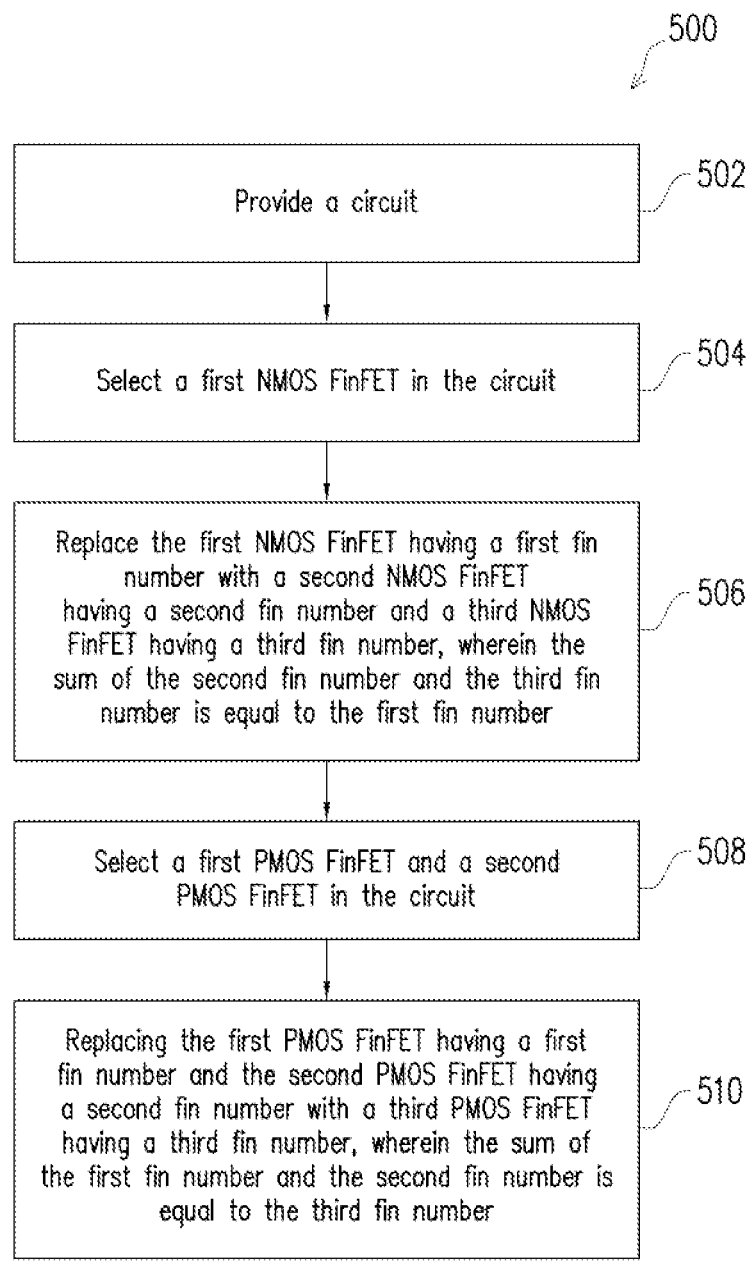
FIG. 5 is a flow chart illustrating an example method in accordance with some embodiments.

FIG. 5 is a flow chart illustrating an example method 500 in accordance with some embodiments. In general, the method 500 may be regarded as a combination of the method 100 shown in FIG. 1 and the method 300 shown in FIG. 3. In the example shown in FIG. 5, the method 500 starts at step 502 where a circuit is provided. The circuit can be any circuit that includes both NMOS FinFETs and PMOS FinFETs. In some non-limiting examples, the circuit is an analog circuit that deals with continuous analog signals. For example, the analog circuit may include at least one of: a differential amplifier, an operational amplifier (Op Amp), a radio frequency (RF) amplifier, a comparator, a current mirror, an analog multiplier, an analog divider, an analog-to-digital converter (ADC), a digital-to-analog converter (DAC), a voltage controlled oscillators (VCO), an I/Q modulator, and an analog switch multiplexer or the like. On the other hand in some non-limiting examples, the circuit is a digital circuit that deals with discrete digital signals. For example, the digital circuit may include at least one of: a logic AND gate, a logic OR gate, an inverter, a logic NAND gate, a logic NOR gate, a flip flop, a multiplexer (i.e., a data selector), a synchronous sequential logic circuit, an asynchronous sequential logic circuit or the like.

The method 500 then proceeds to step 504 where a first NMOS FinFET in the circuit is selected. The first NMOS FinFET is often selected based on considerations associated with the saturation current (Idsat) and the leakage current (Ioff) of the first NMOS FinFET, though theoretically any NMOS FinFET in the circuit may be selected. For instance, the first NMOS FinFET may be a NMOS FinFET in a write driver of a static random-access-memory (SRAM) device (details of which will be described below with reference to FIG. 7A), as the leakage current of that NMOS FinFET in the write driver contributes significantly to the overall leakage of the SRAM device. It should be noted that NMOS FinFETs in the circuit other than the first NMOS FinFET may also be selected. In other words, multiple NMOS FinFETs in the circuit may be selected at step 504.

The method 500 then proceeds to step 506 where the first NMOS FinFET is replaced with a second NMOS FinFET and a third NMOS FinFET. Specifically, the first NMOS FinFET has a first fin number, the second NMOS FinFET has a second fin number, and the third NMOS FinFET has a third fin number. The larger the fin number is, the wider the overall fin structure is. The first fin number is equal to the sum of the second fin number and the third fin number. As such, the width of the overall fin structure is unchanged after the replacement. However, the overall leakage current of the second NMOS FinFET and the third NMOS FinFET is smaller than that of the first NMOS FinFET, because an NMOS FinFET with a smaller fin size has a higher saturation-to-leakage ratio due to a higher electron mobility.

The method 500 then proceeds to step 508 where a first PMOS FinFET and a second PMOS FinFET in the circuit are selected. The first PMOS FinFET and the second PMOS FinFET are often selected based on considerations associated with the saturation current (Idsat) and the leakage current (Ioff) of the first PMOS FinFET and the second PMOS FinFET, though theoretically any two of PMOS FinFETs in the circuit may be selected. For instance, the first PMOS FinFET and the second PMOS FinFET may be PMOS FinFETs in header cells of a SRAM device (details of which will be described below with reference to FIG. 7A), as the leakage currents of that PMOS FinFETs in the header cells contribute significantly to the overall leakage of the SRAM device. It should be noted that PMOS FinFETs in the circuit other than the first PMOS FinFET and the second PMOS FinFET may also be selected in addition to the first PMOS FinFET and second PMOS FinFET. In other words, more than two (e.g., four) PMOS FinFETs in the circuit may be selected at step 508.

The method 500 then proceeds to step 510 where the first PMOS FinFET and the second PMOS FinFET are replaced with a third PMOS FinFET. Specifically, the first PMOS FinFET has a first fin number, the second PMOS FinFET has a second fin number, and the third PMOS FinFET has a third fin number. The larger the fin number is, the wider the overall fin structure is. The third fin number is equal to the sum of the first fin number and the second fin number. As such, the width of the overall fin structure is unchanged after the replacement. However, the leakage current of the third PMOS FinFET is smaller than the overall leakage current of the first PMOS FinFET and the second PMOS FinFET, because a PMOS FinFET with a larger fin size has a higher saturation-to-leakage ratio due to a higher hole mobility.

Figure 6:
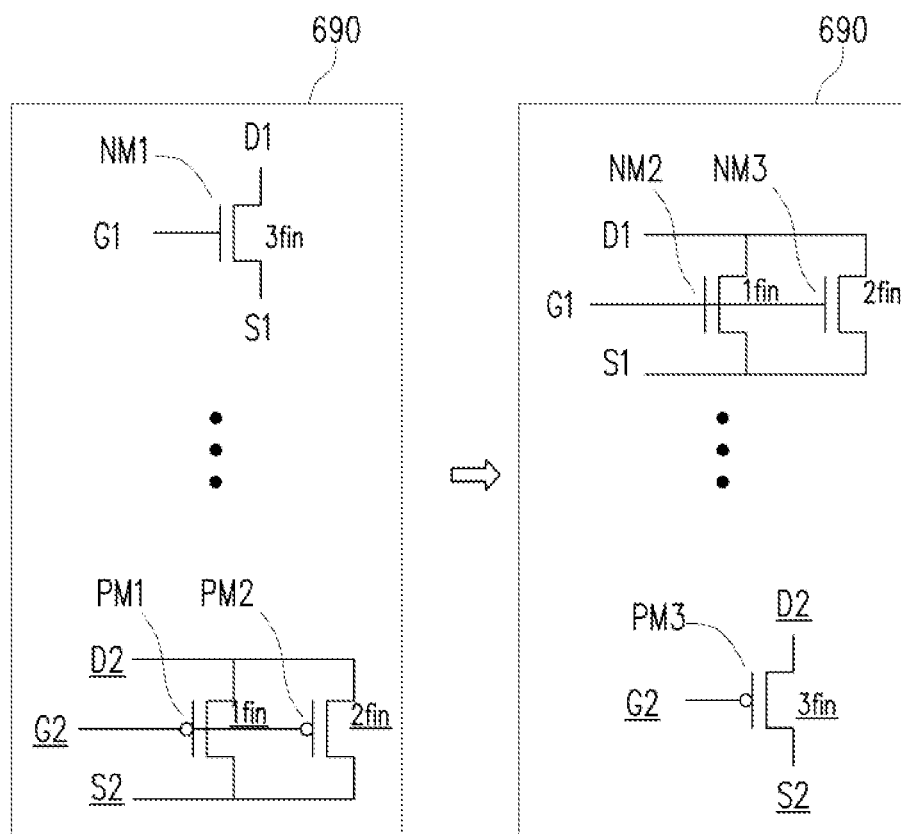
FIG. 6 is a diagram illustrating a replacement of a NMOS FinFET and multiple PMOS FinFETs using the method of FIG. 5 in accordance with some embodiments.

FIG. 6 is a diagram illustrating a replacement of a NMOS FinFET and multiple PMOS FinFETs using the method 500 of FIG. 5 in accordance with some embodiments. As the method 500 may be regarded as a combination of the method 100 shown in FIG. 1 and the method 300 shown in FIG. 3, FIG. 6 may be regarded as a combination of FIG. 2A and FIG. 4A. Specifically, a circuit 690 includes, among other things, a NMOS FinFET NM1 and two PMOS FinFETs PM1 and PM2. The NMOS FinFET NM1 is selected at step 504. The NMOS FinFET NM1 has a gate G1, a source S1, and a drain D1. Specifically, the NMOS FinFET NM1 has three fins (i.e., a gate structure is over three parallel fin structures and controls those three fin structures). At step 506 shown in FIG. 5, the NMOS FinFET NM1 is replaced with a NMOS FinFET NM2 and a NMOS FinFET NM3. Specifically, the NMOS FinFET NM2 has one fin, while the NMOS FinFET NM3 has two fins. The NMOS FinFET NM2 has the gate G1, the source S1, and the drain D1; the NMOS FinFET NM3 has the gate G1, the source S1, and the drain D1 as well. In other words, the gates, the sources, and the drains of the NMOS FinFETs NM2 and NM3 are connected, respectively.

On the other hand, the PMOS FinFETs PM1 and PM2 are selected at step 508 shown in FIG. 5. Specifically, the PMOS FinFET PM1 has one fin (i.e., a gate structure is over one fin structure and controls this fin structure), while the PMOS FinFET PM2 has two fins (i.e., a gate structure is over two fin structures and controls those two fin structures). The PMOS FinFET PM1 has a gate G2, a source S2, and a drain D2; the PMOS FinFET PM2 has the gate G2, the source S2, and the drain D2. In other words, the gates, the sources, and the drains of the PMOS FinFETs PM1 and PM2 are connected, respectively. At step 510 shown in FIG. 5, the PMOS FinFETs PM1 and PM2 are replaced with a PMOS FinFET PM3. Specifically, the PMOS FinFET PM3 has three fins. The PMOS FinFET PM3 has the gate G2, the source S2, and the drain D2.

As such, for the NMOS FinFETs, the overall fin number is unchanged (i.e., both are three) after the replacement at step 506 shown in FIG. 5. However, the overall leakage current of the NMOS FinFETs NM2 and NM3 is smaller than that of the NMOS FinFET NM1, because an NMOS FinFET with a smaller fin size has a higher saturation-to-leakage ratio due to a higher electron mobility. On the other hand for the PMOS FinFETs, the overall fin number is unchanged (i.e., both are three) after the replacement at step 510 shown in FIG. 5. However, the leakage current of the PMOS FinFET PM3 is smaller than the overall leakage current of the PMOS FinFET PM1 and the PMOS FinFET PM2, because a PMOS FinFET with a larger fin size has a higher saturation-to-leakage ratio due to a higher hole mobility. Therefore, the overall leakage current of the circuit 690 is reduced after the replacement at step 506 and step 508 shown in FIG. 5.

Figure 7A:
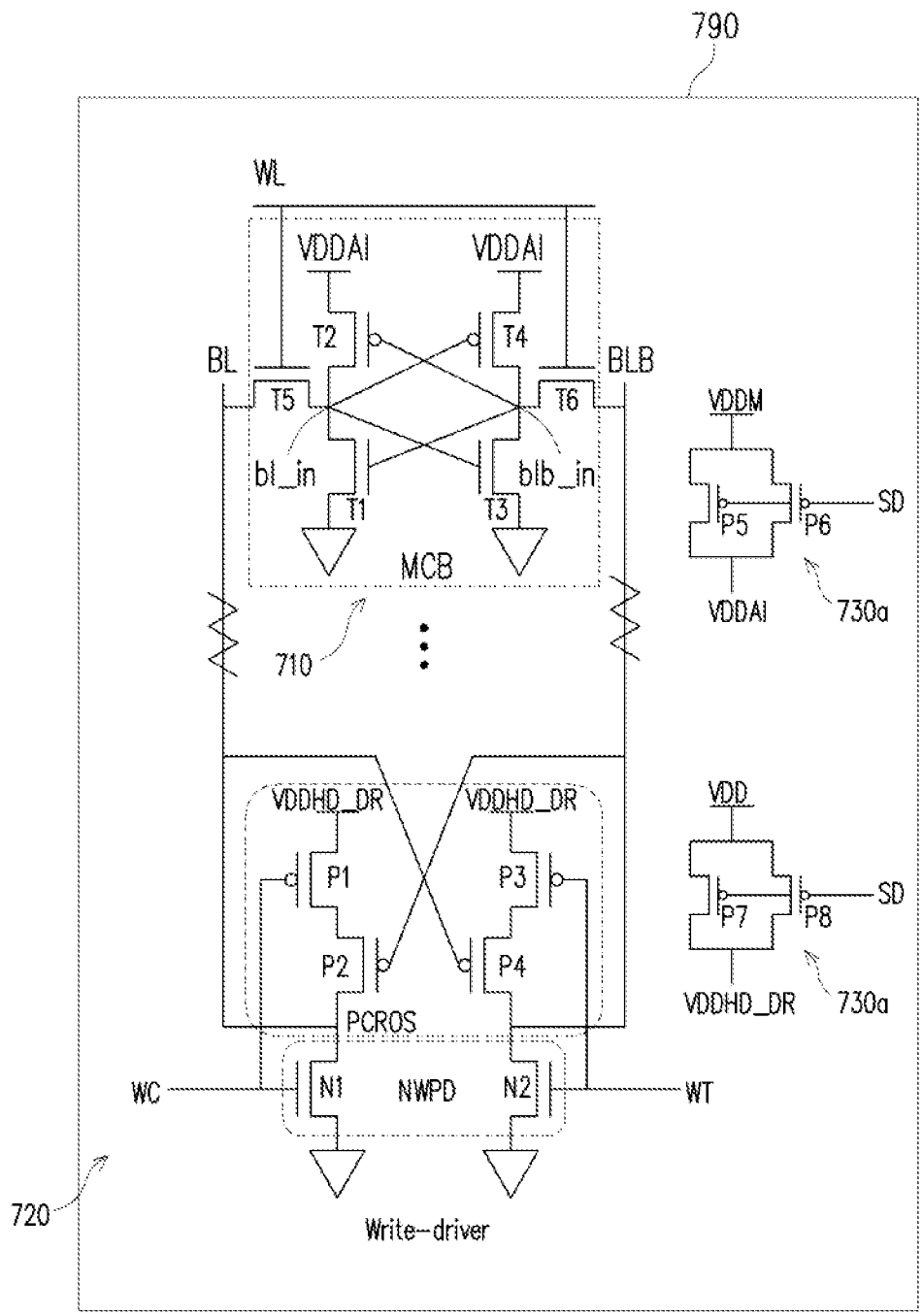
FIG. 7A is a diagram of a SRAM device to which the method of FIG. 5 may be applied in accordance with some embodiments.
Figure 7B:
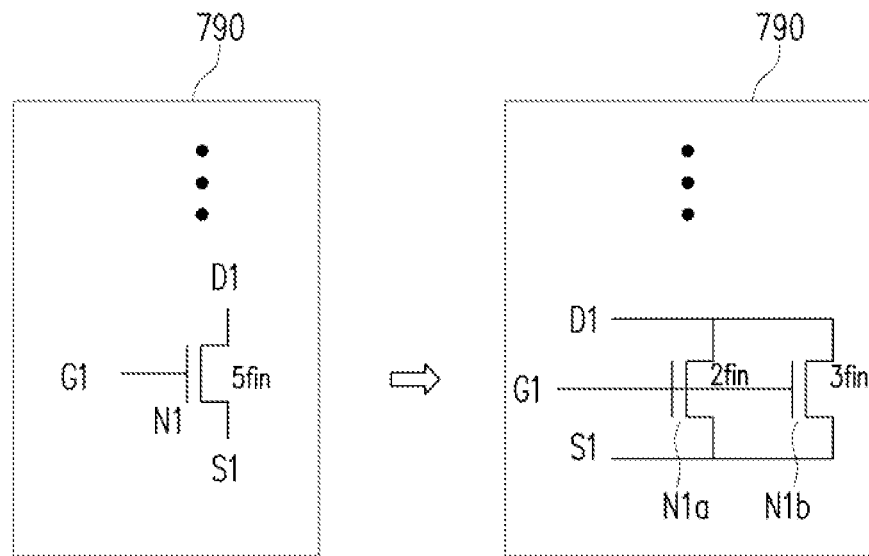
FIG. 7B is a diagram illustrating the application of the method of FIG. 5 in accordance with some embodiments.
Figure 7C:
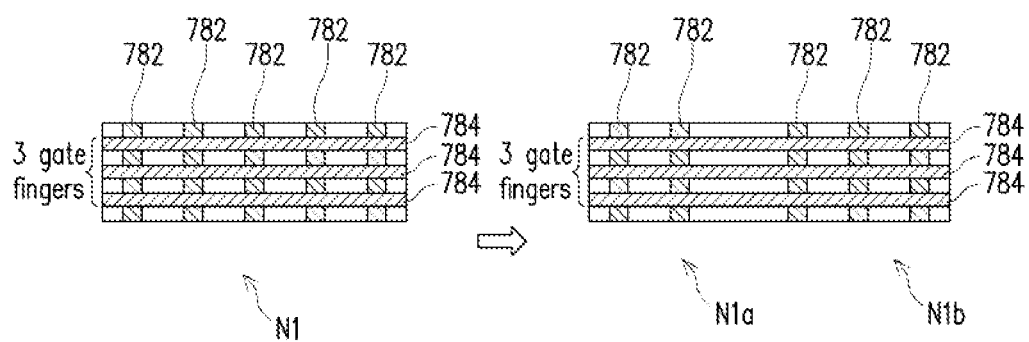
FIG. 7C is a diagram illustrating layouts corresponding to FIG. 7B in accordance with some embodiments.
Figure 7D:
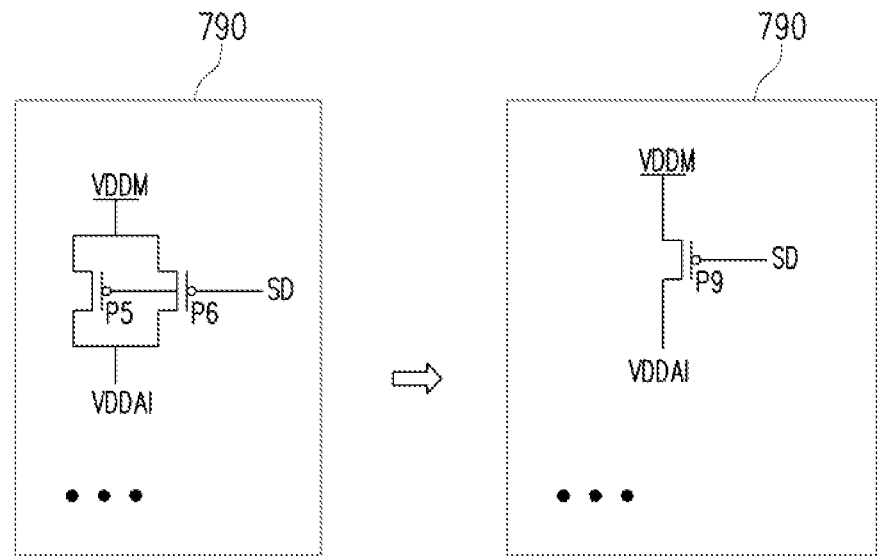
FIG. 7D is a diagram illustrating the application of the method of FIG. 5 in accordance with some embodiments.
Figure 7E:
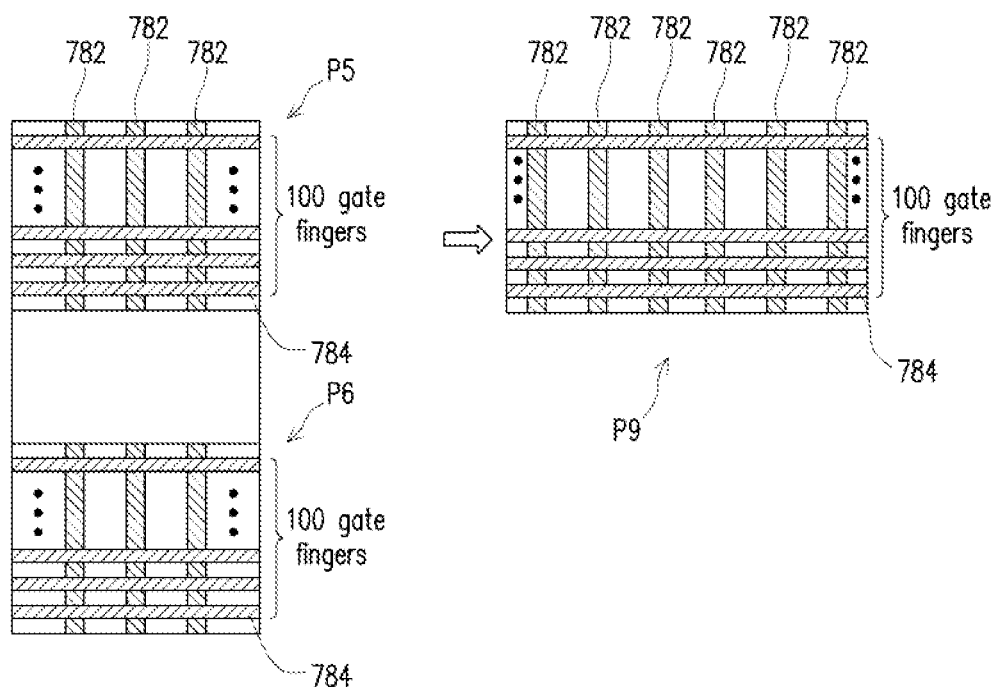
FIG. 7E is a diagram illustrating layouts corresponding to FIG. 7D in accordance with some embodiments.

FIG. 7A is a diagram of a SRAM device to which the method 500 of FIG. 5 may be applied in accordance with some embodiments. FIG. 7B is a diagram illustrating the application of the method 500 of FIG. 5 in accordance with some embodiments, while FIG. 7C is a diagram illustrating layouts corresponding to FIG. 7B in accordance with some embodiments. FIG. 7D is a diagram illustrating the application of the method 500 of FIG. 5 in accordance with some embodiments, while FIG. 7E is a diagram illustrating layouts corresponding to FIG. 7D in accordance with some embodiments. As shown in FIG. 7A, the SRAM circuit (also "SRAM device", which will be used interchangeably) 790 includes, among other things, a memory array 710, word lines (WL), bit lines (BL and BLB), write driver 720 for write operations, and header circuits 730a and 730b (collectively 730). It should be noted that the SRAM circuit 790 may include other components such as a memory controller not shown, a read driver not shown, a row decoder not shown, a column decoder not shown, and an I/O circuit not shown.

The memory array 710 includes multiple memory cell bits (MCBs) arranged in columns and rows. For each memory cell bit (MCB), the MCB may be coupled by complementary bit lines BL and BLB, and data can be read from and written to the MCB via the complementary bit lines BL and BLB. In the example shown in FIG. 7A, the MCB includes but is not limited to a six-transistor (6T) SRAM structure. In some embodiments more or fewer than six transistors may be used to implement the MCB. For example, the MCB in some embodiments may use a 4T, 8T or 10T SRAM structure. The MCB shown in FIG. 7A includes a first inverter formed by a NMOS/PMOS FinFET pair T1 and T2, a second inverter formed by a NMOS/PMOS FinFET pair T3 and T4, and access FinFETs T5 and T6. FinFETs T1, T3, T5 and T6 are NMOS FinFETs, and FinFETs T2 and T4 are PMOS FinFETs.

In the illustrated example, the MCB operates in a first power domain (i.e., VDDM) and thus is connected to a VDDM power rail through the header circuit 730a. The header circuit 730a, as shown in the illustrated example, includes two PMOS FinFETs P5 and P6 connected in parallel. Sources of the PMOS FinFETs P5 and P6 are coupled to the VDDM power rail, while drains of the PMOS FinFETs P5 and P6 are coupled to a terminal VDDAI, which is in turn coupled to sources of PMOS FinFETs T2 and T4. The PMOS FinFETs P5 and P6 are turned on or turned off in response to a shutdown (SD) signal for saving power consumption during a sleep mode of the SRAM circuit 790.

On the other hand, in the example shown in FIG. 7A, the write driver 720 includes, among other things, four PMOS FinFETs P1, P2, P3, P4 and two NMOS FinFETs. The PMOS FinFETs P1 and P2 are connected in series between a terminal VDDHD_DR and the NMOS FinFET N1, while the PMOS FinFETs P3 and P4 are connected in series between a terminal VDDHD_DR and the NMOS FinFET N2. The terminal VDDHD_DR is provided with a voltage in a second power domain (i.e., VDD), which is lower than the first power domain (i.e., VDDM). Gates of the PMOS FinFET P1 and the NMOS FinFET N1 are connected to a first write signal WC, while gates of the PMOS FinFET P3 and the NMOS FinFET N2 are connected to a second write signal WT. Gate of the PMOS FinFETs P2 and P4 are connected to the complementary bit lines BLB and BL.

In the illustrated example, the write driver 720 operates in a second power domain (i.e., VDD) and thus is connected to a VDD power rail through the header circuit 730b. The header circuit 730b, as shown in the illustrated example, includes two PMOS FinFETs P7 and P8 connected in parallel. Sources of the PMOS FinFETs P7 and P8 are coupled to the VDD power rail, while drains of the PMOS FinFETs P7 and P8 are coupled to the terminal VDDHD_DR, which is in turn coupled to the sources of the PMOS FinFETs P1 and P3. The PMOS FinFETs P7 and P8 are turned on or turned off in response to a shutdown (SD) signal for saving power consumption during the sleep mode of the SRAM circuit 790.

Referring to FIGS. 7B and 7C, the method 500 of FIG. 5 may be applied to the NMOS FinFET N1. It should be noted that the method 500 of FIG. 5 may be applied to the NMOS FinFET N2 as well, which is not described in detail for simplicity. As mentioned above, the NMOS FinFET N1 is a NMOS FinFET in the write driver 720 of the SRAM circuit 790, leakage current may be reduced if applying the method 500 of FIG. 5 to the NMOS FinFET N1. In the illustrated example, the NMOS FinFET N1 has five fins 782 and three gate fingers 784, as shown in FIG. 7C. After applying the method 500 of FIG. 5, the NMOS FinFET N1 is replaced by two NMOS FinFETs N1a and N1b. The NMOS FinFET Nia has two fins 782 and three gate fingers 784, while the NMOS FinFET N1b has three fins 782 and three gate fingers 784. Therefore, the fin number of the NMOS FinFET N1 is equal to the sum of those of the NMOS FinFETs N1a and N1b. In other words, the overall fin number is unchanged. However, the overall leakage current of the NMOS FinFETs N1a and N1b is smaller than that of the NMOS FinFET N1, because an NMOS FinFET with a smaller fin size has a higher saturation-to-leakage ratio due to a higher electron mobility.

Referring to FIGS. 7D and 7E, the method 500 of FIG. 5 may be applied to the PMOS FinFETs P5 and P6. It should be noted that the method 500 of FIG. 5 may be applied to the PMOS FinFETs P7 and P8 as well, which is not described in detail for simplicity. As mentioned above, each of the PMOS FinFETs P5 and P6 is a PMOS FinFET in the header circuit 730 of the SRAM circuit 790, leakage current may be reduced if applying the method 500 of FIG. 5 to the PMOS FinFETs P5 and P6. In the illustrated example, each of the PMOS FinFETs P5 and P6 has three fins 782 and one hundred gate fingers 784, as shown in FIG. 7E. In other words, the PMOS FinFETs P5 and P6 collectively have three fins 782 and two hundred gate fingers 784. After applying the method 500 of FIG. 5, the PMOS FinFETs P5 and P6 are replaced by a PMOS FinFET P9. The PMOS FinFET P9 has six fins 782 and one hundred gate fingers 784. Therefore, the fin number of the PMOS FinFET P9 is equal to the sum of those of the PMOS FinFETs P5 and P6. In other words, the overall fin number is unchanged. However, the leakage current of the PMOS FinFET P9 is smaller than the overall leakage current of the PMOS FinFET P5 and the PMOS FinFET P6, because a PMOS FinFET with a larger fin size has a higher saturation-to-leakage ratio due to a higher hole mobility.

Therefore, the overall leakage current of the SRAM circuit 790 is reduced after the replacement shown in FIG. 7B and the replacement shown in FIG. 7D. Based on simulation results, by applying the replacement shown in FIG. 7B, the leakage current may be reduced by 3-10% for a standard voltage (e.g., 200 mV), and by 5-10% for a low voltage (e.g., 150 mV). On the other hand, based on simulation results, by applying the replacement shown in FIG. 7D, the leakage current may be reduced by 5-10%.

Moreover, the method 500 of FIG. 5 could be applied to various circuitry. In one non-limiting example, the method could be applied to an inverter, as shown below in FIG. 8. In one non-limiting example, the method could be applied to a word line (WL) driver of a memory device, as shown below in FIG. 9. In one non-limiting example, the method could be applied to a row decoder (YDEC) driver or a column decoder (XDEC) driver of a memory device, as shown below in FIG. 10. It should be noted other applications of the methods 100, 300, and 500 described above are also within the scope of the disclosure.

Figure 8:
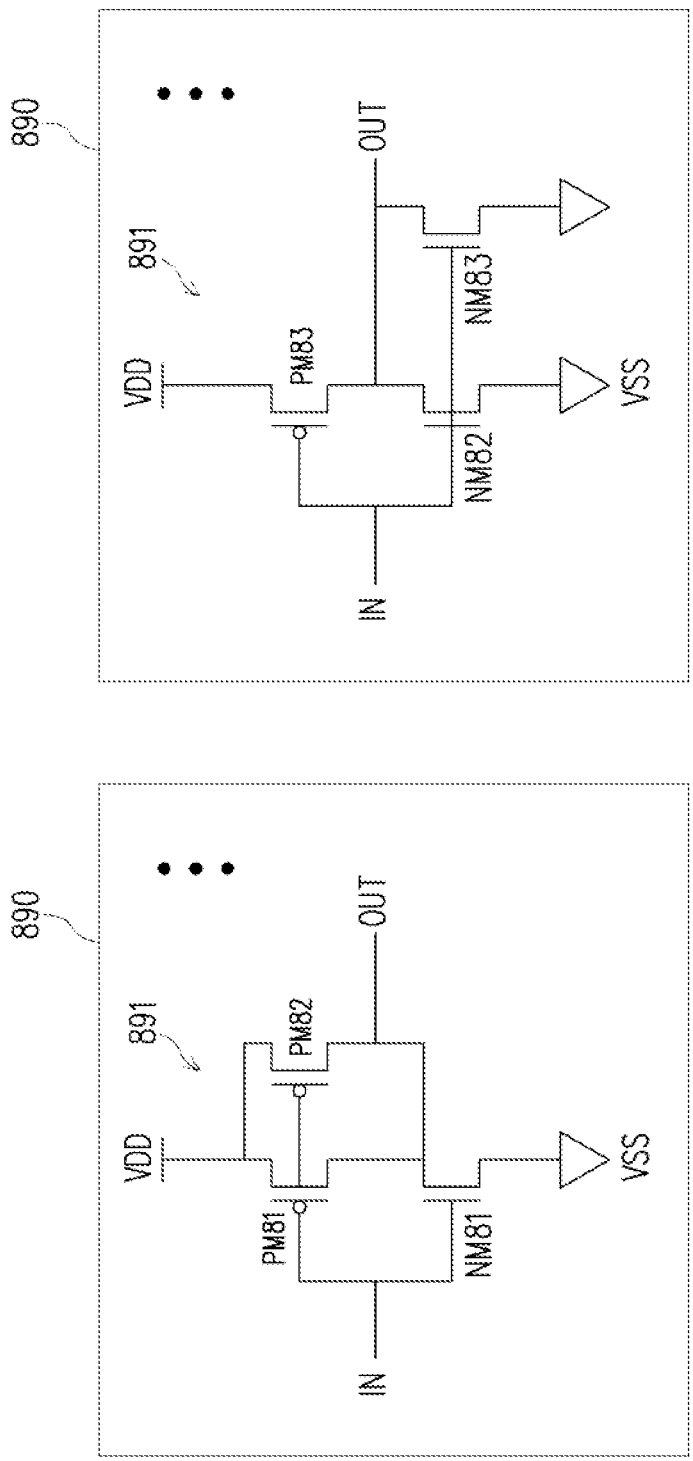
FIG. 8 is a diagram illustrating a circuit that includes an inverter to which the method of FIG. 5 is applied in accordance with some embodiments.

FIG. 8 is a diagram illustrating a circuit 890 that includes an inverter to which the method 500 of FIG. 5 is applied in accordance with some embodiments. As shown in FIG. 8, a circuit 890 may include, among other things, an inverter 891. In the illustrated example, the inverter 891 includes two PMOS FinFETs PM81 and PM82 coupled in parallel. The parallel PMOS FinFETs PM81 and PM82 are connected in series with a NMOS FinFET NM81 between two terminals VDD and VSS. Gates of the PMOS FinFET PM81 and the NMOS FinFET NM81 are connected to an input terminal. Each of the PMOS FinFETs PM81 and PM82 has three fins, while the NMOS FinFET NM81 has five fins. After applying the method 500 of FIG. 5, the PMOS FinFETs PM81 and PM82 are replaced with a PMOS FinFET PM83, while the NMOS FinFET NM81 is replaced with two NMOS FinFETs NM82 and NM83. The PMOS FinFET PM 83 has six fins, the NMOS FinFET NM82 has two fins, while the NMOS FinFET NM83 has three fins. In other words, the fin number of the PMOS FinFET PM83 is equal to the sum of the fin number of the PMOS FinFET PM81 and the fin number of the PMOS FinFET PM82; the fin number of the NMOS FinFET NM81 is equal to the sum of the fin number of the NMOS FinFET NM82 and the fin number of the NMOS FinFET NM83. In other words, the overall fin number is unchanged. However, the overall leakage current is reduced, because a PMOS FinFET with a larger fin size has a higher saturation-to-leakage ratio due to a higher hole mobility, while an NMOS FinFET with a smaller fin size has a higher saturation-to-leakage ratio due to a higher electron mobility.

Figure 9:
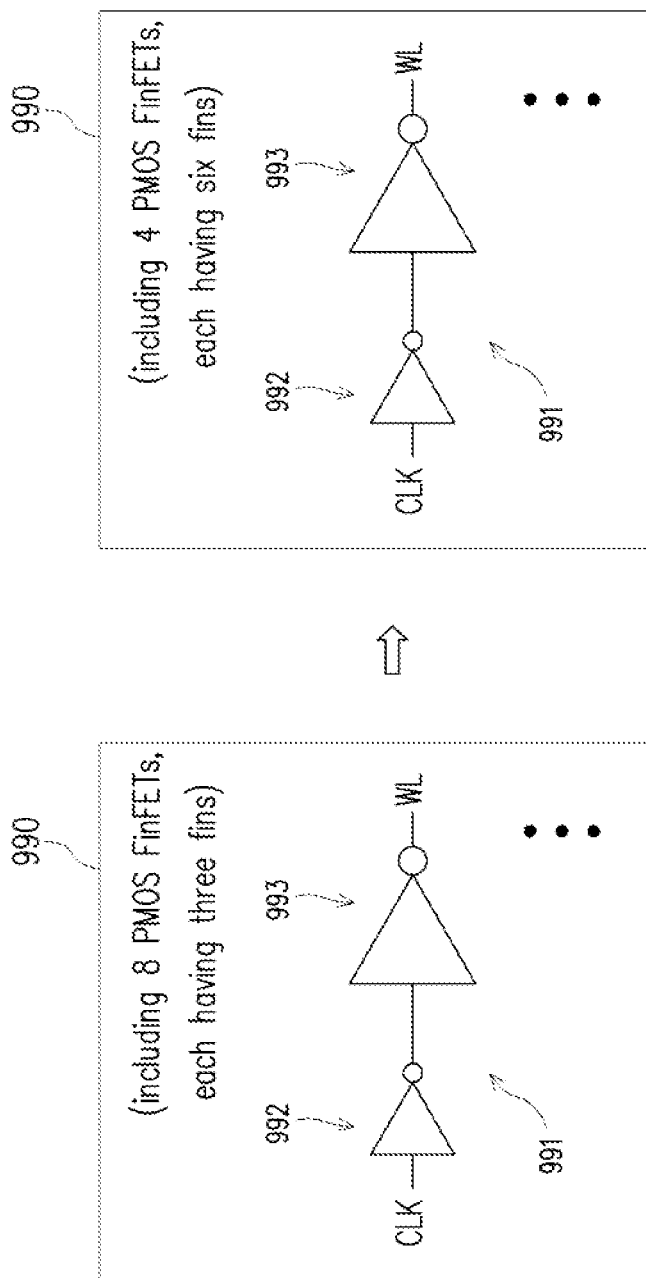
FIG. 9 is a diagram illustrating a memory device circuit that includes a word line driver to which the method of FIG. 5 is applied in accordance with some embodiments.

FIG. 9 is a diagram illustrating a memory device circuit 990 that includes a word line driver to which the method 500 of FIG. 5 is applied in accordance with some embodiments. As shown in FIG. 9, a memory device circuit 990 may include, among other things, a word line driver 991. The memory device circuit 990 may be a SRAM device, though other types of memory devices are also within the scope of the disclosure. In the illustrated example, the word line driver 991 includes two inverters 992 and 993 connected in series between a clock signal terminal CLK and a word line signal terminal WL. The inverter 993 is the last stage, therefor having a relatively large contribution to leakage current. The inverter 993 includes, for example, eight PMOS FinFETs, each of which has three fins. After applying the method 500 of FIG. 5, the eight PMOS FinFETs are replaced with four PMOS FinFETs, each of which has six fins. In other words, the overall fin number of the PMOS FinFETs is unchanged. However, the overall leakage current is reduced, because a PMOS FinFET with a larger fin size has a higher saturation-to-leakage ratio due to a higher hole mobility. It should be noted that other replacement arrangements (e.g., three PMOS FinFETs, each having eight fins) may be employed as well, as long as the overall fin number is unchanged. It should also be noted that NMOS FinFETs in the inverter 993 may also be replaced similarly by applying the method 500 of FIG. 5.

Figure 10:
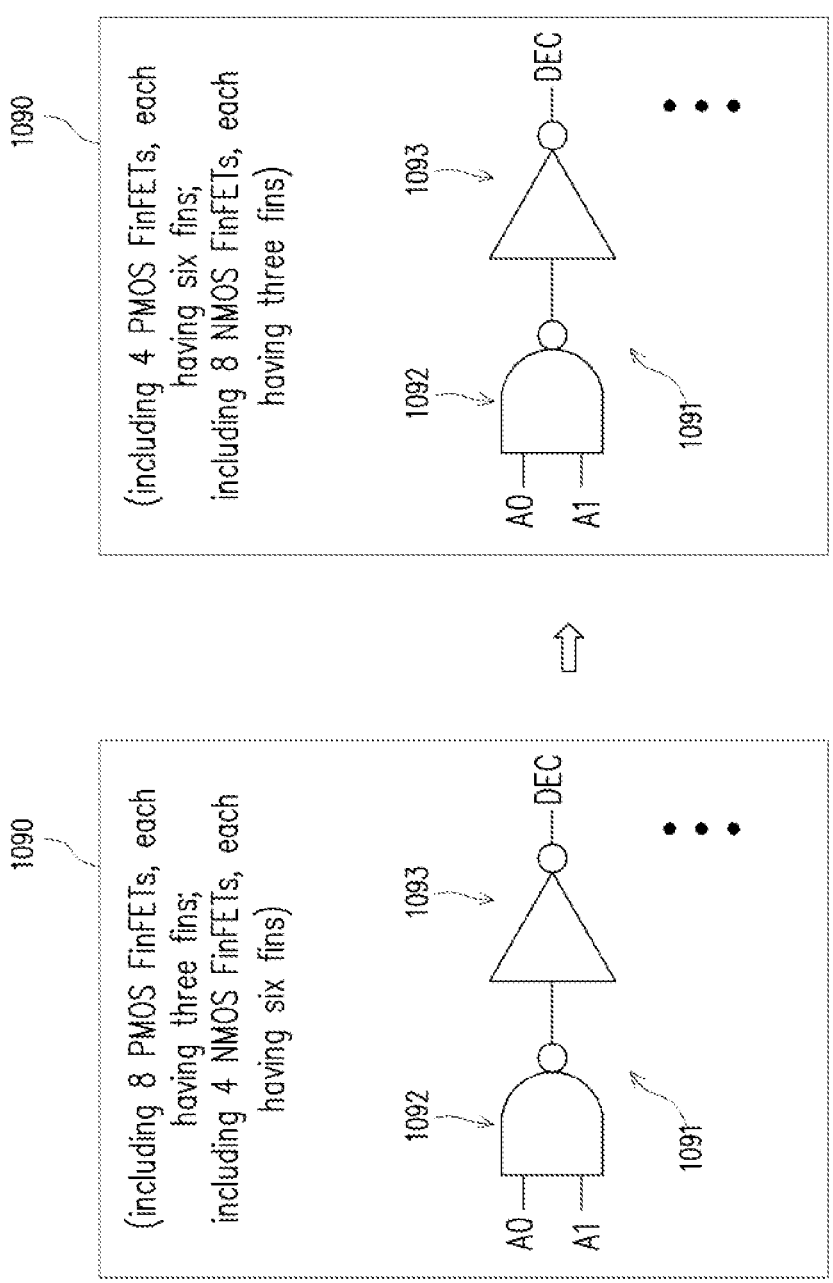
FIG. 10 is a diagram illustrating a memory device circuit that includes a row decoder driver or a column decoder driver to which the method of FIG. 5 is applied in accordance with some embodiments.

FIG. 10 is a diagram illustrating a memory device circuit 1090 that includes a row decoder driver or a column decoder driver to which the method 500 of FIG. 5 is applied in accordance with some embodiments. As shown in FIG. 10, a memory device circuit 1090 may include, among other things, a row decoder driver or a column decoder driver 1091. The memory device circuit 1090 may be a SRAM device, though other types of memory devices are also within the scope of the disclosure. In the illustrated example, the row decoder driver or a column decoder driver 1091 includes a NAND gate 1092 and an inverter 1093 connected in series between two input signal terminals A0, A1 and an output terminal DEC. The inverter 1093 is the last stage, therefor having a relatively large contribution to leakage current. The inverter 1093 includes, for example, eight PMOS FinFETs, each of which has three fins. The inverter 1093 further includes, for example, four NMOS FinFETs, each of which has six fins. After applying the method 500 of FIG. 5, the eight PMOS FinFETs are replaced with four PMOS FinFETs, each of which has six fins; the four NMOS FinFETs are replaced with eight NMOS FinFETs, each having three fins. In other words, the overall fin number of the PMOS FinFETs is unchanged; the overall fin number of the NMOS FinFETs is unchanged. However, the overall leakage current is reduced, because a PMOS FinFET with a larger fin size has a higher saturation-to-leakage ratio due to a higher hole mobility, while an NMOS FinFET with a smaller fin size has a higher saturation-to-leakage ratio due to a higher electron mobility. Again, it should be noted that other replacement arrangements may be employed as well, as long as the overall NMOS/PMOS fin number is unchanged.

In accordance with some disclosed embodiments, a method of designing a circuit is provided. The method includes: providing a circuit; selecting a first NMOS fin field-effect transistor (FinFET) in the circuit; and replacing the first NMOS FinFET having a first fin number with a second NMOS FinFET having a second fin number and a third NMOS FinFET having a third fin number, wherein the sum of the second fin number and the third fin number is equal to the first fin number.

In accordance with some disclosed embodiments, another method of designing a circuit is provided. The method includes: providing a circuit; selecting a first PMOS FinFET and a second PMOS FinFET in the circuit; and replacing the first PMOS FinFET having a first fin number and the second PMOS FinFET having a second fin number with a third PMOS FinFET having a third fin number, wherein the sum of the first fin number and the second fin number is equal to the third fin number.

In accordance with further disclosed embodiments, a SRAM device is provided. The SRAM device includes: a memory cell and a write driver. The memory cell includes: a first inverter; a second inverter cross-coupled to the first inverter; a first access transistor connected between a first data node of the first inverter and a first bit line; a second access transistor connected between a second data node of the second inverter and a second bit line. The write driver includes: a first PMOS FinFET having a first source/drain terminal coupled to a first power terminal; a second PMOS FinFET having a first source/drain terminal coupled to a second source/drain terminal of the first PMOS FinFET, and a gate terminal coupled to the first bit line; a third PMOS FinFET having a first source/drain terminal coupled to the first power terminal; a fourth PMOS FinFET having a first source/drain terminal coupled to a second source/drain terminal of the third PMOS FinFET, and a gate terminal coupled to the second bit line; first and second NMOS FinFETs connected in parallel between a second source/drain terminal of the second PMOS FinFET and a second power terminal, wherein a gate terminal of the first PMOS FinFET and gate terminals of the first and second NMOS FinFETs are connected to receive a first write signal; third and fourth NMOS FinFETs connected in parallel between a second source/drain terminal of the fourth PMOS FinFET and the second power terminal, wherein a gate terminal of the third PMOS FinFET and gate terminals of the third and fourth NMOS FinFETs are connected to receive a second write signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing a circuit, comprising:
   providing a circuit including a write driver comprising:
      a first PMOS FinFET having a first source/drain terminal coupled to a first power terminal;
      a second PMOS FinFET having a first source/drain terminal coupled to a second source/drain terminal of the first PMOS FinFET, and a gate terminal coupled to a first bit line;
      a third PMOS FinFET having a first source/drain terminal coupled to the first power terminal;
      a fourth PMOS FinFET having a first source/drain terminal coupled to a second source/drain terminal of the third PMOS FinFET, and a gate terminal coupled to a second bit line;
      a first NMOS FinFET connected between a second source/drain terminal of the second PMOS FinFET and a second power terminal wherein gate terminal of the first NMOS FinFET is connected to a first write input terminal; and
      a fourth NMOS FinFET connected between a second source/drain terminal of the fourth PMOS FinFET and a second power terminal, wherein a gate terminal of the fourth NMOS FinFET is connected to a second write input terminal;
   determining a first number of fins for the first NMOS FinFET in the circuit based on a first criterion;
   modifying the circuit by replacing the first NMOS FinFET having the first number of fins with a second NMOS FinFET having a second number of fins and a third NMOS FinFET having a third number of fins based on a second criterion, wherein the sum of the second number of fins and the third number of fins is equal to the first number of fins; and generating a circuit design layout based on the modified circuit.

2. The method of claim 1, wherein the circuit further comprises a header circuit connected to the first power terminal, the header circuit comprising:
a fifth PMOS FinFET and a sixth PMOS FinFET connected in parallel,
the method further comprising:
determining a fourth number of fins for the fifth PMOS FinFET in the circuit based on a first criterion;
determining a fifth number of fins for the sixth PMOS FinFET in the circuit based on the first criterion; and
replacing the fifth PMOS FinFET having the fourth number of fins and the sixth PMOS FinFET having the fifth number of fins with a seventh PMOS FinFET having a sixth number of fins based on the second criterion, wherein the sum of the fourth number of fins and the fifth number of fins is equal to the sixth number of fins.

3. The method of claim 2, wherein the providing a circuit includes providing an inverter circuit.

4. The method of claim 2, wherein the word line driver comprises a first inverter and a second inverter connected in series between a clock signal terminal and a word line signal terminal.

5. The method of claim 1, wherein the proving the circuit includes providing a memory cell connected to the write driver.

6. The method of claim 1, wherein the first criterion includes a saturation current (Idsat).

7. The method of claim 1, wherein the first criterion includes a turning-speed.

8. The method of claim 7, wherein the second criterion includes a leakage current (Ioff) at an off state.

9. A method of designing a circuit, comprising:
providing a circuit including a write driver and a header circuit connected to the write driver, the write driver comprising:
a first PMOS FinFET having a first source/drain terminal coupled to a first power terminal;
a second PMOS FinFET having a first source/drain terminal coupled to a second source/drain terminal of the first PMOS FinFET, and a gate terminal coupled to a first bit line;
a third PMOS FinFET having a first source/drain terminal coupled to the first power terminal;
a fourth PMOS FinFET having a first source/drain terminal coupled to a second source/drain terminal of the third PMOS FinFET, and a gate terminal coupled to a second bit line;
a first NMOS FinFET connected between a second source/drain terminal of the second PMOS FinFET and a second power terminal, wherein a gate terminal of the first NMOS FinFET is connected to a first write input terminal; and
a fourth NMOS FinFET connected between a second source/drain terminal of the fourth PMOS FinFET and a second power terminal, wherein a gate terminal of the fourth NMOS FinFET is connected to a second write input terminal;
the header circuit comprising:
a fifth PMOS FinFET and a sixth PMOS FinFET connected in parallel between the first power terminal and a second power terminal;

determining a first number of fins for the fifth PMOS FinFET in the circuit based on a first criterion;
determining a second number of fins for the sixth PMOS FinFET in the circuit based on the first criterion;
modifying the circuit by replacing the fifth PMOS FinFET having the first number of fins and the sixth FinFET having the second number of fins with a seventh PMOS FinFET having a third number of fins based on a second criterion, wherein the sum of the first number of fins and the second number of fins is equal to the third number of fins; and
generating a circuit design layout based on the modified circuit.

10. The method of claim 9, further comprising:
determining a fourth number of fins for the first NMOS FinFET in the circuit based on the first criterion;
replacing the first NMOS FinFET having the fourth number of fins with a second NMOS FinFET having a fifth number of fins and a third NMOS FinFET having a sixth number of fins based on the second criterion, wherein the sum of the fifth number of fins and the sixth number of fins is equal to the fourth number of fins.

11. The method of claim 10, wherein the providing a circuit includes providing an inverter circuit.

12. The method of claim 10, wherein the word line driver comprises a first inverter and a second inverter connected in series between a clock signal terminal and a word line signal terminal.

13. The method of claim 12, wherein the second inverter comprises the first NMOS FinFET.

14. The method of claim 9, wherein the first criterion includes a saturation current (Idsat).

15. The method of claim 9, wherein the first criterion includes a turning-speed.

16. The method of claim 15, wherein the second criterion includes a leakage current (Ioff) at an off state.

17. A method of designing a circuit, comprising:
providing a static random-access memory (SRAM) circuit including a memory cell and a write driver, both the memory cell and the write driver coupled between a first bit line and a second bit line;
wherein the write driver comprises:
a first PMOS FinFET having a first source/drain terminal coupled to a first power terminal;
a second PMOS FinFET having a first source/drain terminal coupled to a second source/drain terminal of the first PMOS FinFET, and a gate terminal coupled to the first bit line;
a third PMOS FinFET having a first source/drain terminal coupled to the first power terminal;
a fourth PMOS FinFET having a first source/drain terminal coupled to a second source/drain terminal of the third PMOS FinFET, and a gate terminal coupled to the second bit line;
a first NMOS FinFET having a first number of fins connected between a second source/drain terminal of the second PMOS FinFET and a second power terminal, wherein a gate terminal of the first NMOS FinFET is connected to a first write input terminal; and
a second NMOS FinFET having the first number fins connected between a second source/drain terminal of the fourth PMOS FinFET and a second power terminal, wherein a gate terminal of the second NMOS FinFET is connected to a second write input terminal;

modifying the SRAM circuit, including:
- replacing the first NMOS FinFET with a third NMOS FinFET having a second number of fins and a fourth NMOS FinFET having a third number of fins, wherein the sum of the second number of fins and the third number of fins is equal to the first number of fins; and
- replacing the second NMOS FinFET with a fifth NMOS FinFET having the second number of fins and a sixth NMOS FinFET having the third number of fins; and generating a circuit design layout based on the modified circuit.

18. The method of claim 17, wherein the first number of fins is determined based on a first criterion, and wherein the second number of fins and the third number of fins is based on a second criterion.

19. The method of claim 18, wherein the first criterion includes one of a saturation current (Idsat) or a turning-speed.

20. The method of claim 19, wherein the second criterion includes a leakage current (Ioff) at an off state.

* * * * *